United States Patent
Xu et al.

(10) Patent No.: US 6,326,224 B1
(45) Date of Patent: *Dec. 4, 2001

(54) METHOD OF PURIFYING A PRIMARY COLOR GENERATED BY AN OED

(75) Inventors: Ji-Hai Xu, Gilbert; Franky So, Tempe, both of AZ (US); Hsing-Chung Lee, Calabasas, CA (US)

(73) Assignee: Motorola, Inc., Schaumburg, IL (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/066,797

(22) Filed: Apr. 27, 1998

(51) Int. Cl.$^7$ .................................................. H01L 21/26
(52) U.S. Cl. ............................. 438/29; 438/27; 438/99; 438/70
(58) Field of Search .............................. 438/29, 70, 27, 438/69, 99, 74, 82; 313/504, 506, 509, 498, 110, 503, 505

(56) References Cited

U.S. PATENT DOCUMENTS

| | | | |
|---|---|---|---|
| 5,405,710 | * | 4/1995 | Dodabalapur ......................... 428/690 |
| 5,469,018 | * | 11/1995 | Jacobsen ............................... 313/461 |
| 5,478,658 | * | 12/1995 | Dodabalapur ......................... 428/690 |
| 5,780,174 | * | 7/1998 | Tokito .................................... 428/690 |
| 5,932,895 | * | 8/1999 | Shen ........................................ 257/89 |
| 5,949,187 | * | 9/1999 | Xu et al. ................................ 313/504 |

* cited by examiner

*Primary Examiner*—Mary Wilczewski
*Assistant Examiner*—David Goodwin
(74) *Attorney, Agent, or Firm*—William E. Koch

(57) ABSTRACT

A method of purifying a primary color including providing an organic light emitting diode having a diode light output with a broad spectrum that includes a fraction of the primary color. A microcavity structure is formed in cooperation with the organic light emitting diode to define an optical length of the microcavity structure, and the optical length of the microcavity structure being such that light emitted from the microcavity structure is the primary color, purified.

11 Claims, 1 Drawing Sheet

METHOD OF PURIFYING A PRIMARY COLOR GENERATED BY AN OED

FIELD OF THE INVENTION

The present invention pertains to organic light emitting diodes and more specifically to methods for enhancing the power and/or color of the light output of organic light emitting diodes.

BACKGROUND OF THE INVENTION

Light emitting diode (LED) arrays are becoming more popular as an image source in both direct view and virtual image displays. One reason for this is the fact that LEDs are capable of generating relatively high amounts of light (high luminance), which means that displays incorporating LED arrays can be used in a greater variety of ambient conditions. For example, reflective LCDs can only be used in high ambient light conditions because they derive their light from the ambient light, i.e. the ambient light is reflected by the LCDs. Some transflective LCDs are designed to operate in a transmissive mode and incorporate a backlighting arrangement for use when ambient light is insufficient. In addition, transflective displays have a certain visual aspect and some users prefer a bright emissive display. However, these types of displays are generally too large for practical use in very small devices, such as portable electronic devices.

Organic electroluminescent device (OED) arrays are emerging as a potentially viable design choice for use in small products, especially small portable electronic devices, such as pagers, cellular and portable telephones, two-way radios, data banks, etc. OED arrays are capable of generating sufficient light for use in displays under a variety of ambient light conditions (from little or no ambient light to bright ambient light). Further, OEDs can be fabricated relatively cheaply and in a variety of sizes from very small (less than a tenth millimeter in diameter) to relatively large (greater than an inch) so that OED arrays can be fabricated in a variety of sizes. Also, OEDs have the added advantage that their emissive operation provides a very wide viewing angle.

In spite of all the advantages of OEDs there are still some drawbacks to their use. One of the drawbacks is the fact that light emitted by OEDs is dependent upon the amount of current applied to the OED. Thus, to produce sufficient light for use in displays substantial amounts of current must be applied. As a typical example, with a 64×32 array of devices forming a four line by 11 character display the following devices will use approximately the listed amount of power to produce equal light out. If the devices are semiconductor light emitting diodes the display will require approximately 1 Watt (w) of power; organic light emitting diodes will require approximately 150 mw of power; LCDs with a backlight will require approximately 120 mw of power; and reflective LCDs will require approximately 20 mw of power.

One additional problem with the use of LCDs is the contrast ratio, or the difference between light and dark pixels. LCDs have a contrast ratio of 3–6 while OEDs and LEDs have a contrast ratio in excess of 150. Thus, while OEDs and LEDs produce sufficient light for operation under any ambient light conditions, they use a comparatively large amount of power.

An additional problem in the use of OEDs in displays is the generation of the colors necessary to achieve a full color display. Red, green and blue OEDs can be fabricated but they require different organic materials and, thus, each color must be fabricated separately. Furthermore, the colors achieved are not a pure primary color, but have a relatively broad spectrum. Even though red, green, and blue materials in OEDs are available, only green materials have stable and high brightness emission. There still exists problems associated with reliability and lifetime in blue and red materials.

Accordingly, it is highly desirable to provide a method of enhancing light output of an OED which uses less power.

It is a purpose of the present invention to provide a new and improved method of generating light with improved purity of color.

It is a further purpose of the present invention to provide a method of purifying the light output of an OED having substantially any wavelength.

SUMMARY OF THE INVENTION

The above problems and others are at least partially solved and the above purposes and others are realized in a method of purifying a primary color. The method includes providing an organic light emitting diode having a diode light output with a broad spectrum including a fraction of the primary color. A microcavity structure is formed in cooperation with the organic light emitting diode to define an optical length of the microcavity structure. The optical length of the microcavity structure is such that light emitted from the microcavity structure is the primary color, purified.

In a more specific embodiment, the formation of the microcavity structure includes the step of forming a first microcavity with an optical length such that light emitted from the first microcavity light is the primary color, purified. In yet another embodiment, the formation of the microcavity structure includes a step of forming a second microcavity in tandem with the first microcavity, and the optical length of the second microcavity being such that light emitted from the second microcavity is the primary color further purified. Formation of additional microcavities, in tandem, is also contemplated.

BRIEF DESCRIPTION OF THE DRAWINGS

Referring to the drawings.

DESCRIPTION OF THE PREFERRED EMBODIMENTS

Figure 1:
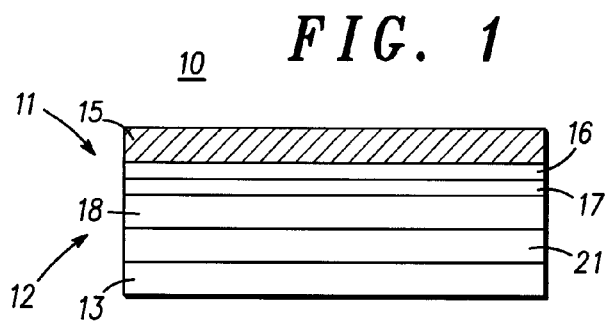
FIG. 1 is an enlarged and simplified sectional view of a microcavity organic light emitting device used in accordance with the method of the present invention.

Turning now to the figures, FIG. 1 is an enlarged and simplified sectional view of a microcavity light emitting device 10 in accordance with the present invention. Microcavity light emitting device 10 includes a light emitting diode, generally designated 11 and a microcavity 12 carried by a transparent substrate 13, such as glass. microcavity 12 is positioned in alignment with the light output from diode 11 to purify the light spectrum.

In this embodiment, light emitting diode 11 includes an organic light emitting diode with an upper metal electrical contact 15, an electron transporting layer 16, a hole transporting layer 17 and a lower electrical contact 18. Upper electrical contact 15 essentially forms a reflective surface to reflect all light generated within diode 11 downwardly. Lower electrical contact 18 is formed of some electrically conductive material which is transparent to light generated in diode 11, such as indium-tin-oxide (ITO) or the like and defines the diode light output for device 10. Electron transporting layer 16 and hole transporting layer 17 define an organic light emitting zone with either or both layers 16 and 17 emitting light in response to the recombination of holes and electrons therein. It will of course be understood that diode 11 could include from one organic layer to several, depending upon the material utilized.

Microcavity 12 is illustrated in FIG. 1 as including diode 11 and a mirror stack 21. Mirror stack 21 includes a plurality of layers of material having different indexes of refraction. The plurality of layers is divided into pairs of layers, one layer of each pair having a first index of refraction and another layer of each pair having a second index of refraction lower than the first index of refraction with each pair of layers cooperating to form a partial mirror and to reflect light. The plurality of layers can be formed from a variety of materials including various semi-transparent metals and various dielectrics. In a typical example, mirror stack 21 is formed of alternate layers of $TiO_2$ and $SiO_2$. Generally, from 2 to 4 pairs of layers provides a reflectivity of approximately 0.74, which is believed to be optimal for the present purpose. As is understood by those skilled in the art, each pair of layers of mirror stack 21 defines a partial mirror with an operating thickness of an integer multiple of one half wavelength of the emitted light so that all reflected light is in phase.

The combined thickness of organic layers 16 and 17 and lower contact 18 is designed to position mirror stack 21 in spaced relationship from reflective upper contact 15 and define an optical length L1 of microcavity 12 in cooperation with the diode 11. Stack 21 further defines a light output for microcavity 12, and the optical length of microcavity 12 is generally designed such that light emitted from the light output is a primary color, purified.

Figure 2:
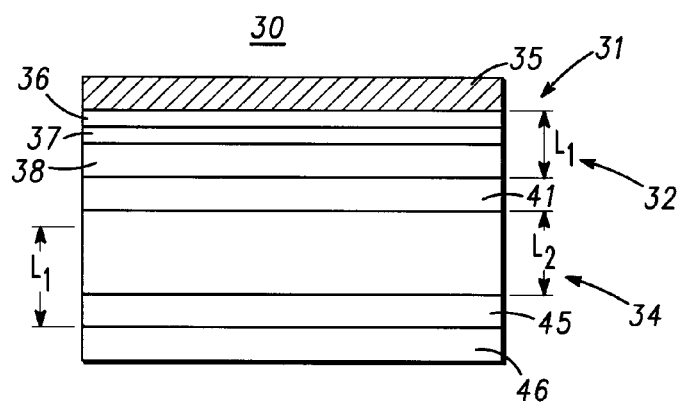
FIG. 2 is an enlarged and simplified sectional view of a multi-microcavity organic light emitting device used in accordance with the method of the present invention.

Turning now to FIG. 2, illustrated is an enlarged and simplified sectional view of a multi-microcavity light emitting device 30 in accordance with the present invention. Multi-microcavity light emitting device 30 includes a light emitting diode, generally designated 31 and a plurality of microcavities 32, and 34 positioned in tandem with the light output from diode 31 to successively purify the light spectrum.

As with the previous embodiment, light emitting diode 31 includes an organic light emitting diode with an upper metal electrical contact 35, an electron transporting layer 36, a hole transporting layer 37 and a transparent lower electrical contact 38. It will of course be understood that diode 31 could include from one organic layer to several, depending upon the material utilized.

Microcavity 32 is illustrated in FIG. 2 as including diode 31 and a mirror stack 41 as described in the previous embodiment. The combined thickness of organic layers 36 and 37, and lower contact 38 is designed to position mirror stack 41 in spaced relationship from reflective upper contact 35 and define an optical length L1 of microcavity 32 in cooperation with the diode 31. Stack 41 further defines a light output for microcavity 32, and the optical length of microcavity 32 is generally designed such that light emitted from the light output is a primary color, purified.

Multi-microcavity light emitting device 30 is substantially identical to device 10 described above, with the addition of a second microcavity, microcavity 34, in tandem with microcavity 32. Microcavity 34 includes a transparent spacer 45 and a mirror stack 46. Spacer 45 is formed of any convenient material which is transparent to the light emitted by diode 31, generally as described above. Mirror stack 46 includes a plurality of layers of material divided into pairs of layers, one layer of each pair having a first index of refraction and another layer of each pair having a second index of refraction lower than the first index of refraction with each pair of layers cooperating to form a partial mirror and to reflect light as has been previously described. Generally, from 2 to 4 pairs of layers provides a reflectivity of approximately 0.74, which is believed to be optimal for the present purpose. Spacer 45 is mounted adjacent stack 41 to receive light from microcavity 32 and positions stack 46 in spaced relationship from microcavity 32 to reflect light from the light output of microcavity 32 back toward microcavity 32 and to define an optical length L2 of microcavity 34. The optical length of microcavity 34 is such that emitted light has a purified spectrum.

Additional microcavities (not shown), each including a transparent spacer with a mirror stack, can be positioned in tandem with microcavities 32 and 34. Each additional microcavity is positioned in tandem with a previous microcavity to provide a light output with a further purified spectrum, as will be explained in more detail presently.

Figure 3:
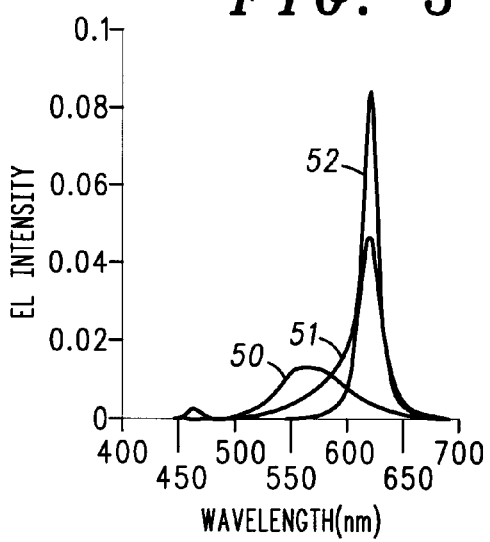
FIG. 3 illustrates the EL spectrum for the devices of FIGS. 1 and 2.

Turning now to FIG. 3, an EL spectrum for a specific embodiment of device 10 of FIG. 1 and device 30 of FIG. 2 is illustrated. In this specific embodiment, an emissive layer is doped with DCM to produce light emission centered at 570 nm as represented by spectrum 50. A second spectrum 51 illustrates the light output from microcavity 12 of device 10 and microcavity 32 of device 30. A third spectrum 52, illustrates the light output from microcavity 34 of device 30. As can be seen from FIG. 3, each light spectrum 50, 51, and 52 is modified from the previous spectrum by reducing the bandwidth and increasing the intensity. Generally, to achieve the result illustrated in FIG. 3 each of the microcavities are tuned to the same wavelength by adjusting the length of the cavity.

If a single microcavity is placed in tandem with the diode and tuned to the peak of the diode output (570 nm) the light output spectrum is narrowed and increased in height. However, the microcavity can be tuned to shift the wavelength toward a more desirable wavelength, as long as the output from the diode contains some portion of that wavelength. Thus, if a diode produces light output containing a fragment of the desired primary color, microcavities can be employed to intensify and purify that color. As can be seen in FIG. 3, the microcavity has an optical length which purifies the light output by narrowing the spectrum and increasing the intensity at approximately 620 nm as shown by spectrum 51. If multiple microcavities are employed, the light output is further purified by the additional microcavities, increasing the intensity and narrowing the spectrum, as shown by spectrum 52.

Figure 4:
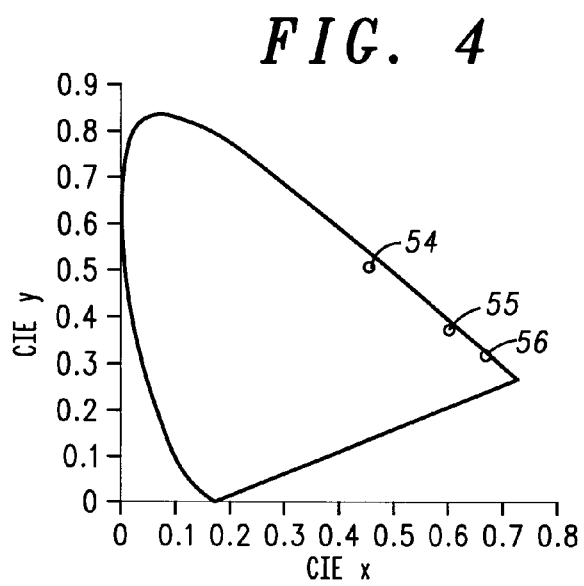
FIG. 4 is a CIE diagram illustrating the CIE coordinates of the light generated in accordance with the method of the present invention.

Typically, the EL spectra from conventional OEDs are very broad, and it is difficult to achieve true and pure primary colors red, green, or blue. Referring to FIG. 4, a CIE diagram is provided, illustrating example values of the light generated. Point 54 indicates the color of the light output from the diode without the use of microcavities (spectrum 50). In this specific example, the CIE coordinates are x=0.4664, y=0.5146. As is clearly shown by this diagram, the color of the light is not a true primary red, but more orange in color. By employing microcavity 12, with an effective optical length of L1=937.5 nm, the spectrum will be shifted toward the red side and the CIE coordinates will be x=0.5969, y=0.3736 as indicated by point 55 which is closer to true primary red. If further purification is desired, additional cavities can be added such as described previously in connection with device 30. As an example, cavity 32 has an effective optical length of L1=937.5 nm, and cavity 34 has an effective optical length of L2=1250 nm. The resulting CIE coordinates are shifted further toward the red to x=0.6682, y=0.3227 indicated by point 56.

It should be noted that microcavity 12 could be tuned to shift the peak of the light spectrum of any color as desired. Thus purified primary red, green and blue can be achieved. By enhancing and purifying the output light, the power used in driving the diode can be reduced until the output is commensurate with the needs of a specific application. In this fashion, an organic light emitting diode (electroluminescent device) with multi-microcavities in tandem will use less than 20 mw in the example first described above.

Thus, an OED with enhanced and purified light output which uses less power has been disclosed. The new and improved light emitting device with enhanced light output uses less electrical power than similar devices and approximately the same amount of power as a reflective LCD while providing the substantial viewing advantages of an OED. Further, the new and improved light emitting device can be tuned to improved colored light output.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A method of purifying a primary color comprising the steps of:

providing an organic light emitting diode including a diode light output with a broad spectrum including a fraction of the primary color, the diode light output having a broad spectrum light output and a light spectrum peak at a first wavelength; and forming a microcavity structure in cooperation with the organic light emitting diode to define an optical length of the microcavity structure, and the optical length of the microcavity structure being such that the light emitted from the microcavity structure is the primary color, purified, having a narrower light spectrum than the broad spectrum diode light output, a greater intensity than the diode light output, and a second light spectrum peak at a second wavelength, the second wavelength differing from the first wavelength.

2. A method of purifying a primary color as claimed in claim 1 wherein the step of forming a microcavity structure includes the step of forming a first microcavity with an optical length such that light emitted from the first microcavity light is the primary color, purified.

3. A method of purifying a primary color as claimed in claim 2 wherein the step of forming a microcavity structure includes a step of forming a second microcavity in tandem with the first microcavity, and the optical length of the second microcavity being such that light emitted from the second microcavity is the primary color further purified.

4. A method of purifying a primary color as claimed in claim 1 wherein the step of forming a microcavity structure includes forming a plurality of microcavities.

5. A method of purifying a primary color comprising the steps of:

providing an organic light emitting diode including a diode light output with a broad spectrum including a fraction of the primary color, the diode light output having a broad spectrum light output and a light spectrum peak at a specific wavelength;

forming a first microcavity including a first plurality of layers of material having different indexes of refraction such that the first plurality of layers operates as a first mirror stack, positioning the first plurality of layers in spaced relationship from the diode light output to reflect light from the diode light output toward the organic light emitting diode and to cooperate with the organic light emitting diode to define an optical length of the first microcavity, the first plurality of layers further defining a first microcavity light output, and the optical length of the first microcavity being such that light emitted from the first microcavity light output is the primary color, purified, the light output having a narrower light spectrum than the broad spectrum diode light output, greater intensity than the broad spectrum diode light output, and a light spectrum peak at a wavelength that differs from the wavelength of the light spectrum peak of the broad spectrum diode light output; and forming a second microcavity including a second plurality of layers of material having different indexes of refraction such that the second plurality of layers operates as a second mirror stack, the second plurality of layers being positioned in spaced relationship from the first microcavity light output to reflect light from the first microcavity light output toward the first microcavity and to define an optical length of the second microcavity, the second plurality of layers further defining a second microcavity light output, and the optical length of the second microcavity being such that light emitted from the second microcavity light output is the primary color, further purified, the light output having a narrower light spectrum than the light output of the first microcavity, greater intensity than the light output of the first microcavity, and a light spectrum peak at a wavelength that differs from the wavelength of the light spectrum peak of the broad spectrum diode light output.

6. A method as claimed in claim 5 wherein the step of providing an organic light emitting diode includes sandwiching an organic light emitting, zone between first and second electrical contacts with the first electrical contact being transparent to emitted light and defining the diode light output.

7. A method as claimed in claim 6 further including forming the second electrical contact of the organic light emitting diode to include metal, the metal forming a reflective surface in the organic light emitting diode opposite the diode light output.

8. A method as claimed in claim 5 wherein the step of forming first and second microcavities having pluralities of layers of material each include forming pairs of layers, one layer of each pair having a first index of refraction and another layer of each pair having a second index of refraction lower than the first index of refraction with each pair of layers cooperating to reflect light.

9. A method as claimed in claim 8 wherein each pair of layers of the first and second pluralities of layers defines a partial mirror with an operating thickness of an integer multiple of one half wavelength of the emitted light.

10. A method as claimed in claim 8 wherein each pair of layers includes a layer of silicon dioxide and a layer of titanium dioxide.

11. A method of purifying a primary color comprising the steps of:

provided an organic light emitting diode including a diode light output with a broad spectrum including a fraction of the primary color, the diode light output having a broad spectrum light output and a light spectrum peak at a first wavelength; and forming a microcavity structure in cooperation with the organic light emitting diode to define an optical length of the microcavity structure, and the optical length of the microcavity structure being such that the light emitted from the microcavity structure is the primary color, purified, having a narrower light spectrum than the broad spectrum diode light output, greater intensity than the broad spectrum diode light output, and a light spectrum peak that is shifted to a wavelength that is different than the wavelength of the light spectrum peak of the broad spectrum light output.

* * * * *